United States Patent
Fujii et al.

(10) Patent No.: US 11,621,696 B2
(45) Date of Patent: Apr. 4, 2023

(54) TUNING FORK-TYPE VIBRATOR AND MANUFACTURING METHOD FOR THE SAME

(71) Applicant: DAISHINKU CORPORATION, Kakogawa (JP)

(72) Inventors: Tomo Fujii, Kakogawa (JP); Hiroaki Yamashita, Kakogawa (JP)

(73) Assignee: DAISHINKU CORPORATION, Hyogo (JP)

( * ) Notice: Subject to any disclaimer, the term of this patent is extended or adjusted under 35 U.S.C. 154(b) by 917 days.

(21) Appl. No.: 16/473,441

(22) PCT Filed: Dec. 19, 2017

(86) PCT No.: PCT/JP2017/045511
§ 371 (c)(1),
(2) Date: Jun. 25, 2019

(87) PCT Pub. No.: WO2018/142790
PCT Pub. Date: Aug. 9, 2018

(65) Prior Publication Data
US 2020/0153408 A1 May 14, 2020

(30) Foreign Application Priority Data
Jan. 31, 2017 (JP) .............................. JP2017-015345

(51) Int. Cl.
*H03H 9/21* (2006.01)
*H03H 3/04* (2006.01)

(52) U.S. Cl.
CPC ................ *H03H 9/21* (2013.01); *H03H 3/04* (2013.01); *H03H 2003/0442* (2013.01); *H03H 2003/0492* (2013.01)

(58) Field of Classification Search
CPC .. H03H 9/10; H03H 9/13; H03H 9/21; H03H 9/215; H03H 9/1021
See application file for complete search history.

(56) References Cited

U.S. PATENT DOCUMENTS

| | | | |
|---|---|---|---|
| 2008/0106172 A1* | 5/2008 | Tanaya | H03H 9/19 |
| | | | 310/344 |
| 2016/0260887 A1 | 9/2016 | Fujii et al. | |
| 2016/0344362 A1* | 11/2016 | Kobayashi | H03H 9/21 |

FOREIGN PATENT DOCUMENTS

| | | |
|---|---|---|
| JP | S51-075128 A | 6/1976 |
| JP | 2011-193436 A | 9/2011 |
| JP | 2011-234000 A | 11/2011 |
| JP | 2013-157907 A | 8/2013 |
| JP | 2013-183407 A | 9/2013 |
| JP | 2015-103927 A | 6/2015 |
| JP | 2015-128267 A | 7/2015 |
| JP | 2016-220118 A | 12/2016 |

\* cited by examiner

*Primary Examiner* — Jeffrey M Shin
(74) *Attorney, Agent, or Firm* — Norris McLaughlin, P.A.

(57) ABSTRACT

A tuning fork-type vibration piece is provided, in which a cushioning portion is formed on the base of a package and allowed to contact parts for contact of arm portions which are any parts but their edges, and the parts for contact of the arm portions that contact the cushioning portion are electrodeless regions, which prevents the risk of frequency fluctuations caused by any electrode being chipped off by contact with the cushioning portion.

5 Claims, 9 Drawing Sheets

TUNING FORK-TYPE VIBRATOR AND MANUFACTURING METHOD FOR THE SAME

TECHNICAL FIELD

The present invention relates to a tuning fork-type vibrator which is typically used, as clock source, in electronic devices, and a manufacturing method for the tuning fork-type vibrator.

BACKGROUND ART

The tuning fork-type vibrator is embedded, typically as clock source and together with an oscillator circuit, in a wide range of electronic devices including watches.

The tuning fork-type vibrator includes a package, and a tuning fork-type vibration piece supported in the package in a cantilever fashion. The tuning fork-type vibrator, if subjected to any impact from outside, may warp in its thickness direction, and such warp may cause edges of arm portions of the crystal vibration piece to contact the bottom surface of the package. Then, shock generated at the time of contact may damage or break the edges of arm portions. In the tuning fork-type vibration piece, these edges of arm portions, if thus damaged or broken, may be most likely to undergo frequency fluctuations.

Patent document 1 addresses this issue by providing a cushioning portion, like a pillow, on the bottom surface of the package. The tuning fork-type vibration piece described in this document is so structured that intermediate parts of arm portions, which are located at positions leading to their edges, are allowed to contact the cushioning portion in case the vibration piece is warped under any impact. This may avoid any contact of the edges of arm portions with the bottom surface of the package and possible damage to or breakage of the edges.

CITATION LIST

Patent Documents

Patent Document 1: Japanese Patent No. 5175128

SUMMARY OF THE INVENTION

Technical Problems

Advancing miniaturization of electronic devices in recent years is demanding smaller and thinner tuning fork-type vibrators having outer dimensions of, for example, 1.2 mm×1.0 mm or less in plan view and thicknesses of 0.35 mm or less.

Frequency fluctuations due to external impact may be even more likely to occur in such smaller and thinner tuning fork-type vibrators, which may be unpreventable with an additional means, like the cushioning portion formed on the bottom surface of the package described earlier.

In case the tuning fork-type vibration piece is warped in its thickness direction under impact from outside, the cushioning portion may allow the edges of arm portions to stay out of contact with the bottom surface of the package. Yet, the edges of arm portions possibly contact the inner surface of a lid member on the upper side of the package, in which case corner parts on the edges may chip off, causing frequency fluctuations.

The present invention was accomplished to address the issue of the known art, and is directed to providing a tuning fork-type vibrator that may excel in shock resistance and accordingly suppress the risk of frequency fluctuations, and a manufacturing method for the tuning fork-type vibrator.

Solutions to Problem

To this end, the present invention provides the following technical aspects.

A tuning fork-type vibrator according to an aspect of the present invention includes: a tuning fork-type vibration piece having a stem portion and a plurality of arm portions extending from the stem portion; a package body including a housing portion in which the tuning fork-type vibration piece is housed; and a lid member that seals an opening of the package body containing the tuning fork-type vibration piece. The stem portion is joined to an electrode in the housing portion of the package. The plurality of arm portions have frequency adjustment metal films formed at free ends on their surfaces facing an inner surface of the lid member, and the frequency adjustment metal films have been partly removed. In case the plurality of arm portions are warped toward the lid member, the frequency adjustment metal films partly removed contact the inner surface of the lid member so as to avoid contact of edges on the free ends of the plurality of arm portions with the inner surface of the lid member.

In case the crystal vibration piece according to the present invention is warped toward the lid member under impact from outside, the frequency adjustment metal films, which are formed at intermediate positions of the arm portions leading to their free-end edges, are allowed to contact the inner surface of the lid member. This may avoid any contact between the inner surface of the lid member and the edges of arm portions most likely to undergo frequency fluctuations contact and possible damage to or breakage of corner parts on these edges. As a result, the risk of impact-caused frequency fluctuations may be suppressed.

Preferably, the frequency adjustment metal films formed at the free ends may be partly removed along a longitudinal direction of the plurality of arm portions from edges on the free ends toward the stem portion in a length less than or equal to half a length of the frequency adjustment metal films along the longitudinal direction.

Thus, the frequency adjustment metal films are removed along the longitudinal direction of the arm portions from edges on the free ends toward the stem portion in a length less than or equal to half a length of the frequency adjustment metal films along the longitudinal direction, i.e., the frequency adjustment metal films are left unremoved in a length greater than half the length thereof along the longitudinal direction. In case the tuning fork-type vibration piece is warped toward the lid member under impact from outside, the frequency adjustment metal films adequately left unremoved may certainly contact the inner surface of the lid member. This may prevent contact of edges of the arm portions with the inner surface of the lid member and possible damage to or breakage of corner parts on these edges.

Preferably, the free ends of the plurality of arm portions provided with the frequency adjustment metal films may be greater in width than any other parts of the plurality of arm portions.

The regions of the frequency adjustment metal films thus increased in the direction of width of the arm portions may allow a greater extent of frequency adjustment even with microminiaturized tuning fork-type vibration pieces.

Preferably, d/L may be less than or equal to 0.11, where d is a length of the frequency adjustment metal films removed from the edges on the free ends of the plurality of arm portions along the longitudinal direction, and L is a length of the tuning fork-type vibration piece, and t/H may be greater than or equal to 0.25 and less than or equal to 0.43, where t is a thickness of the frequency adjustment metal films, and H is an interval between the inner surface of the lid member and a part of the plurality of arm portions where the frequency adjustment metal films are unformed.

Thus, d/L, i.e., the ratio of the length d of the frequency adjustment metal films removed from the edges on the free ends of arm portions along the longitudinal direction to the length L of the tuning fork-type vibration piece, is set to a value less than or equal to 0.11. In other words, the length d of the frequency adjustment metal films to be removed is regulated to stay within a certain range of values relative to the length L of the tuning fork-type vibration piece. Further, t/H, i.e., the ratio of the thickness t of the frequency adjustment metal films to the interval H between the inner surface of the lid member and a part of the arm portions not provided with the frequency adjustment metal films, is set to a value greater than or equal to 0.25 and less than or equal to 0.43. In other words, the thickness t of the frequency adjustment metal films is regulated to stay within a certain range of values relative to the interval H between the inner surface of the lid member and a part of the arm portions not provided with the frequency adjustment metal films. With the length and thickness values being regulated in this manner, the frequency adjustment metal films partly removed may reliably contact the inner surface of the lid member in case the tuning fork-type vibration piece is warped toward the lid member. This may prevent contact of edges of the arm portions with the inner surface of the lid member and possible damage to or breakage of corner parts on these edges.

Preferably, the frequency adjustment metal films may have a thickness greater than or equal to 9 μm.

After the frequency adjustment metal films as thick as 9 μm or more are partly removed for frequency adjustment, an adequate portion of these metal films may still be left on the arm portions. In case the tuning fork-type vibration piece is warped toward the lid member under impact from outside, the frequency adjustment metal films adequately left unremoved may certainly contact the inner surface of the lid member and alleviate well any shock at the time of contact.

Preferably, the stem portion may have a metal bump formed to join the tuning fork-type vibration piece to the electrode in the housing portion of the package body, and the metal bump may include a material used to form the frequency adjustment metal films.

The frequency adjustment metal films and the metal bump may be accordingly formed together in a single step.

A manufacturing method for a tuning fork-type vibrator according to the present invention includes: a first step of forming electrodes in a stem portion and in a plurality of arm portions extending from the stem portion of a respective one of a plurality of tuning fork-type vibration pieces integrally coupled on a wafer; a second step of forming a frequency adjustment metal film at one end on one of front and back main surfaces of a respective one of the plurality of arm portions in a direction of extension thereof; a third step of performing frequency adjustment by partly removing the frequency adjustment metal films formed at the one ends; and a fourth step of housing each one of the plurality of tuning fork-type vibration pieces divided and separated from the wafer in a housing portion formed in a package body and then sealing an opening of the package body with a lid member.

In the fourth step, the stem portions of the plurality of tuning fork-type vibration pieces are each joined to an electrode in the housing portion of the package body in a manner that the one of the front and back main surfaces faces a lid member. The ratio of an absolute value of difference between a second target frequency in the second step and a third target frequency in the third step to an absolute value of difference between the second target frequency and a first target frequency in the first step is less than or equal to 0.5.

In the manufacturing method for a tuning fork-type vibrator according to the present invention, the first target frequency is set for the first step of forming electrodes in the arm portions, the second target frequency is set for the second step of forming the frequency adjustment metal films at one ends of the arm portions, and the third target frequency is set for the third step of performing frequency adjustment by partly removing the frequency adjustment metal films, and the ratio of an absolute value of difference between the second and third target frequencies to an absolute value of difference between the first and second target frequencies is less than or equal to 0.5. With this ratio being regulated to stay at 0.5 or less, the extent of frequency variation when the second target frequency of the second step shifts to the third target frequency of the third step is smaller than the extent of frequency variation when the first target frequency of the first step shifts to the second target frequency of the second step, which is rephrased that the frequency adjustment metal films partly removed in the third step is less than the frequency adjustment metal films formed at the one ends of the arm portions in the second step.

After the frequency adjustment metal films for frequency adjustment in the third step, there is still an adequate portion of the frequency adjustment metal films left unremoved. In case the arm portions of the crystal vibration piece are warped toward the lid member under impact from outside, therefore, the frequency adjustment metal films adequately remaining on the arm portions may certainly contact the inner surface of the lid member. This may avoid any contact between the inner surface of the lid member and the edges of arm portions most likely to undergo frequency fluctuations contact and possible damage to or breakage of corner parts on these edges.

In the second step, the frequency adjustment metal films may preferably be formed in a thickness greater than or equal to 9 μm.

After the frequency adjustment metal films as thick as 9 μm or more are partly removed for frequency adjustment, an adequate portion of these metal films may still be left on the arm portions. In case the arm portions of the crystal vibration piece are warped toward the lid member under impact from outside, therefore, the frequency adjustment metal films may certainly contact the inner surface of the lid member and alleviate well any shock at the time of contact.

In the third step, the frequency adjustment metal films formed at the one ends of the plurality of arm portions in the direction of extension thereof may preferably be removed along the direction of extension from edges on the one ends toward the stem portion in a length less than or equal to half a length of the frequency adjustment metal films along the longitudinal direction.

Thus, the frequency adjustment metal films are removed along the longitudinal direction of the arm portions from edges on the free ends toward the stem portion in a length less than or equal to half a length of the frequency adjustment metal films along the longitudinal direction, i.e., the frequency adjustment metal films are left unremoved in a length greater than half the length thereof along the longitudinal direction. In case the tuning fork-type vibration piece is warped toward the lid member under impact from outside, the frequency adjustment metal films adequately left unremoved may certainly contact the inner surface of the lid member. This may prevent contact of edges of the arm portions with the inner surface of the lid member and possible damage to or breakage of corner parts on these edges.

Effects of the Invention

According to the present invention, in case the crystal vibration piece is warped in its thickness direction, the frequency adjustment metal films, which are formed at positions leading to the free-end edges of the arm portions, contact the inner surface of the lid member, preventing possible contact of these edges with the inner surface of the lid member. This may avoid any contact between the inner surface of the lid member and the edges of arm portions most likely to undergo frequency fluctuations contact and possible damage to or breakage of corner parts on these edges. Thus, the present invention may successfully provide a tuning fork-type vibrator that may excel in shock resistance and accordingly suppress the risk of frequency fluctuations.

EMBODIMENTS OF THE INVENTION

Embodiments of the present invention are hereinafter described in detail referring to the accompanying drawings.

First Embodiment

Figure 1:
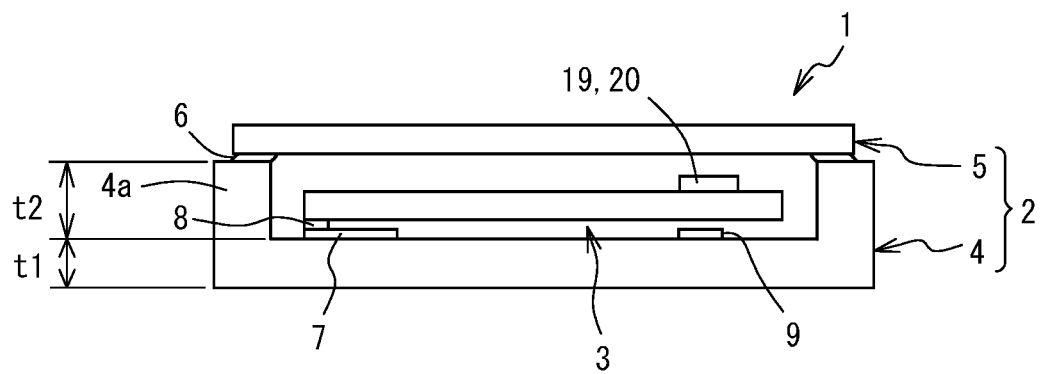
FIG. 1 is a schematic view in cross section of a tuning fork-type crystal vibrator according to an embodiment of the present invention.
Figure 2:
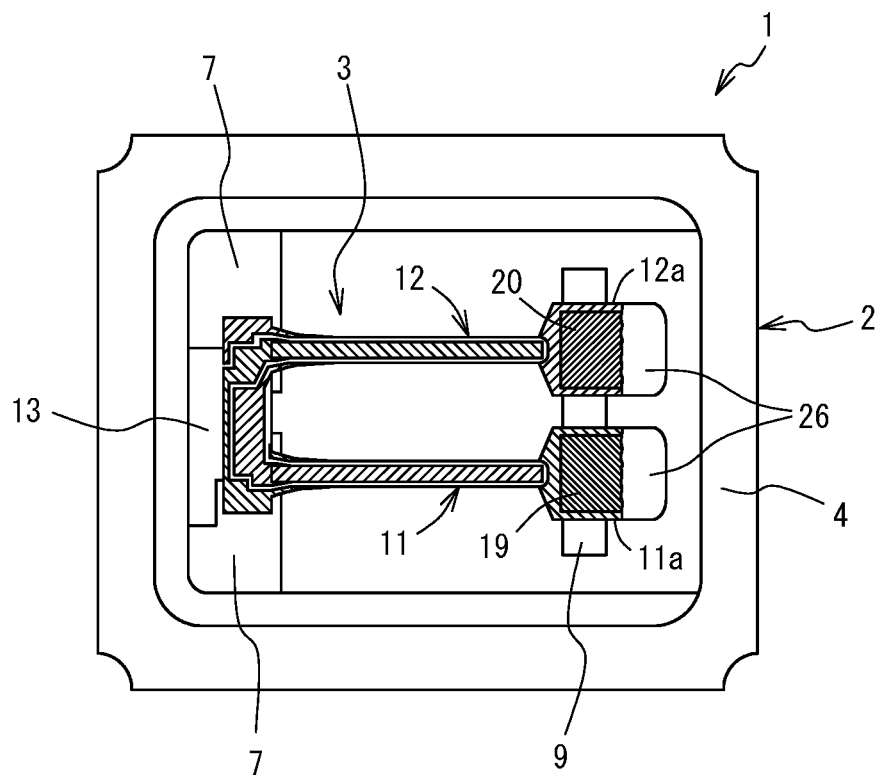
FIG. 2 is a plan view of the crystal vibrator illustrated in FIG. 1 from which a lid member has been detached.
Figure 3:
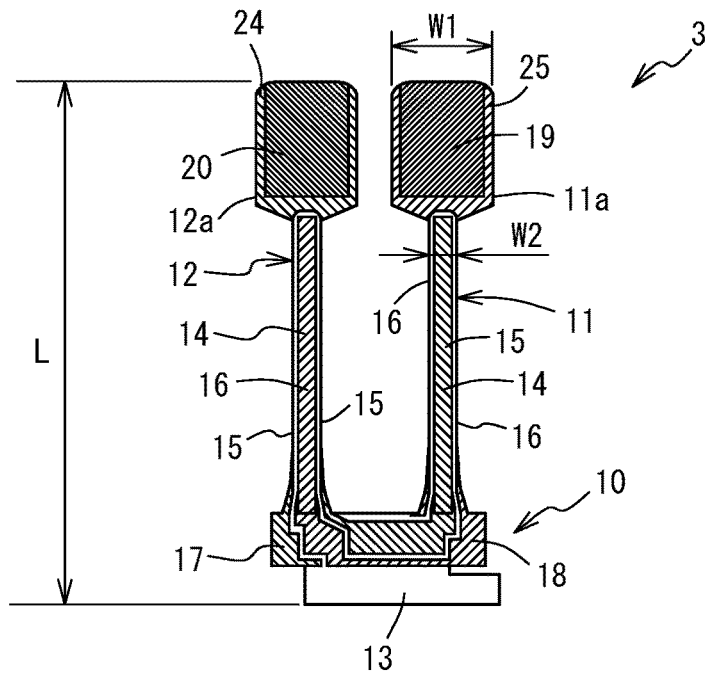
FIG. 3 is a drawing of a main-surface side of a tuning fork-type crystal vibration piece.
Figure 4:
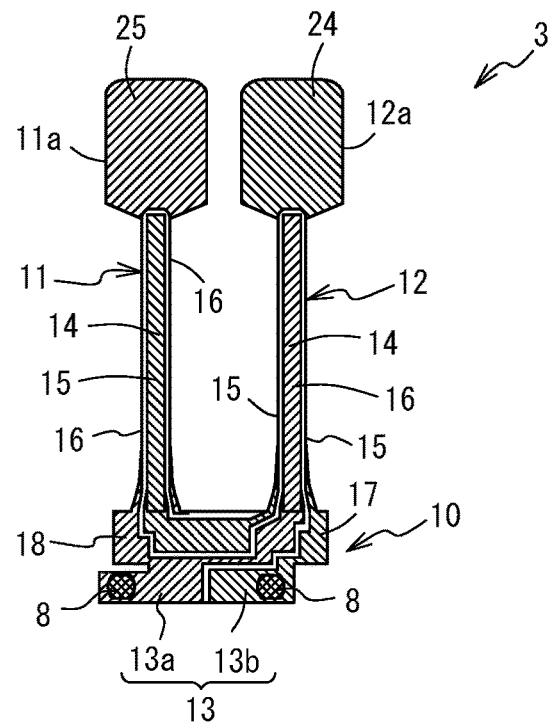
FIG. 4 is a drawing of another main-surface side of the crystal vibration piece.

FIG. 1 is a schematic view in cross section of a tuning fork-type crystal vibrator 1 according to an embodiment of the present invention. FIG. 2 is a plan view of the crystal vibrator illustrated in FIG. 1 from which a lid member 5 has been detached. FIG. 3 is a drawing of a main-surface side of a tuning fork-type crystal vibration piece 3. FIG. 4 is a drawing of another main-surface side of the crystal vibration piece 3. FIGS. 3 and 4 illustrate the crystal vibration piece 3 before frequency adjustment metal films 19 and 20 formed thereon are partly removed by the laser beam irradiation. FIG. 2 illustrates the crystal vibration piece 3 in which the raw surface of crystal 26 is exposed after the laser-used removal in part of the frequency adjustment metal films 19 and 20.

In the tuning fork-type crystal vibrator 1 according to this embodiment, the tuning fork-type crystal vibration piece 3 is housed in a package 2 made of, for example, a ceramic material. The package 2 includes a base 4; package body, and a lid member 5. The base 4 and the lid member 5 are joined to each other with a sealing member 6. Specifically, the tuning fork-type crystal vibration piece 3 is joined, with a pair of metal bumps 8; joining material, to a pair of electrode pads 7 on the base 4 having an opening on its upper side, and the plate-shaped lid member 5 is joined to the base 4 so as to close the opening. The joining material is not necessarily limited to the metal bumps 8 and may be selected from other materials, for example, conductive resin adhesives and brazing filler materials.

While the nominal frequency of this tuning fork-type crystal vibrator 1 according to this embodiment is 32.768 kHz, other frequencies may be applicable instead of the nominal frequency.

The base 4 of the package 2 is a container having insulating properties which is made of, for example, a ceramic or glass material. In this embodiment, the material of the base 4 is a ceramic material, and the base 4 is formed by firing. The base 4 has an opening on its upper side, and its inside has a recessed shape surrounded by a peripheral wall 4a. The recessed inside of the base 4 is a housing portion for the tuning fork-type crystal vibration piece 3. On the inside of the base 4, the paired electrode pads 7 are formed on the bottom surface at positions on one end side in the longitudinal direction of the base 4 (lateral direction on FIGS. 1 and 2). The electrode pads 7 are electrically connected to terminal electrodes, not illustrated in the drawings, on the back surface of the base 4 through a wiring pattern (not illustrated in the drawing). At a position on the bottom surface of the base 4 on its longitudinally other end side, a cushioning portion 9, like a pillow, is formed so as to extend in a direction orthogonal to the longitudinal direction of the base 4 (vertical direction on FIG. 2). The tuning fork-type crystal vibration piece 3 is supported in the package in a cantilever fashion, and this structure possibly causes the crystal vibration piece 3 to warp toward the bottom surface of the base 4 under any impact from outside. When such an event occurs, the cushioning portion 9 serves to prevent possible damage to or breakage of edges of the crystal vibration piece 3 on its free end side by avoiding direct contact between the edges and the bottom surface of the base 4.

The lid member 5 is a solid plate rectangular in plan view and made of, for example, a metal, ceramic, or glass material. In this embodiment, a metal material is used to form the lid member 5.

The tuning fork-type crystal vibrator 1 according to this embodiment is a microminiaturized and very thin vibrator in which the package 2 rectangular in plan view have outer dimensions of, for example, 1.2 mm×1.0 mm, and a thickness (height) of, for example, 0.35 mm, inclusive of the lid member 5.

The size of the package 2 of the crystal vibrator 1 according to the present invention is not necessarily limited to the before-mentioned dimensions. This package may be formed in a rectangular shape in plan view having outer dimensions of, for example, 2.0 mm×1.6 or 1.6 mm×1.0 mm, and a height of, for example, 0.45 mm, inclusive of the lid member 5.

In this embodiment, the base 4 has a thickness t1 of, for example, 0.09 mm at its bottom illustrated in FIG. 1, and the peripheral wall 4a of the base 4 has a thickness (height) t2 of, for example, 0.15 mm. The tuning fork-type crystal vibration piece 3 of approximately 0.08 mm in thickness is housed in the recessed housing portion inside of the base 4. In the package 2, therefore, there are clearances of, for example, approximately 0.035 mm above and below the crystal vibration piece 3.

Multiple tuning fork-type crystal vibration pieces 3 are obtained from a sheet of crystal wafer not illustrated in the drawing. The outer shapes of these crystal vibration pieces 3 are collectively formed at once on the crystal wafer by photolithography, specifically by, for example, wet etching using a resist or metal film as mask As illustrated in FIGS. 3 and 4, the crystal vibration piece 3 includes a stem portion 10, and a pair of first and second arm portions 11 and 12; vibrating members; extending in parallel from one end side of the stem portion 10. The stem portion 10 includes a joining portion 13 joined to the base 4. The joining portion 13 of this embodiment is formed so as to extend in a direction opposite to a direction of extension of the first and second arm portions 11 and 12 and further extend in one of directions orthogonal to the arm portion-extending direction (rightward on FIG. 3).

The first and second arm portions 11 and 12 respectively have tip-side parts 11a and 12a. The tip-side parts 11a and 12a are greater in width than the other parts of these arm portions in a direction orthogonal to the arm portion-extending direction, i.e., in a direction of width of the first, second arm portion 11, 12 (lateral direction on FIGS. 3 and 4). Referring to FIG. 3, "W1" indicates the width. The cushioning portion on the bottom surface of the base 4 is formed in a certain thickness so as to face the regions each having the width W1 of the tip-side parts 11a and 12a of the first and second arm portions 11 and 12. The height, i.e., thickness, of the cushioning portion 9 may be, for example, 0.01 mm.

Further, the first and second arm portions 11 and 12 respectively have grooves 14 on their main surfaces illustrated in FIGS. 3 and 4. The grooves 14 are formed along the arm portion-extending direction.

The tuning fork-type crystal vibration piece 3 includes two first driving electrodes 15 and second driving electrodes 16, and extraction electrodes 17 and 18 that are respectively extracted from the driving electrodes 15 and 16 to electrically connect these driving electrodes to the electrode pads 7 of the base 4. The first and second driving electrodes 15 and 16 are partly formed in the grooves 14 of the two main surfaces.

The first driving electrodes 15 are respectively formed on both main surfaces of the first arm portion 11 inclusive of the grooves 14 and on both side surfaces of the second arm portion 12. The first driving electrodes 15 are connected to the extraction electrode 17. Similarly, the second driving electrodes 16 are respectively formed on both main surfaces of the second arm portion 12 inclusive of the grooves 14 and on both side surfaces of the first arm portion 11, and the second driving electrodes 16 are connected to the extraction electrode 18.

In the first and second arm portions 11 and 12, tip-of-arm electrodes 25 and 24 are respectively formed in regions of the tip-side parts 11a and 12a increased in width along their circumferences. The tip-of-arm electrodes 25 formed on the tip-side part 11a along its circumference is connected to the second driving electrodes 16 formed on the side surfaces of the first arm portion 11. The tip-of-arm electrode 24 formed on the tip-side part 12a along its circumference is connected to the first driving electrodes 15 formed on the side surfaces of the second arm portion 12.

Frequency adjustment metal films 19 and 20 are formed on the tip-of-arm electrodes 25 and 24 of the tip-side parts 11a and 12a on one main-surface side illustrated in FIG. 3. The frequency adjustment metal film 19, 20 is formed in a slightly smaller area than the tip-of-arm electrode 25, 24 and is irradiated with, for ample, a laser beam and thereby reduced in mass for coarse frequency adjustment of the crystal vibration piece 3. The frequency adjustment metal films 19 and 20 are formed as far as edges of the arm portions 11 and 12, i.e., edges of the widened tip-side parts 11a and 12a.

The frequency adjustment metal films 19 and 20, which will be partly removed by the laser beam irradiation, are formed so as to face the inner surface of the lid member 5, as illustrated in FIG. 1, so as to contact the inner surface of the lid member 5 in case the arm portions 11 and 12 of the tuning fork-type vibration piece 3 are warped toward the lid member 5 under impact from outside. This may prevent possible contact between the inner surface of the lid member and edges of the widened tip-side parts 11a and 12a of the arm portions 11 and 12 on their free end side.

The first and second driving electrodes 15 and 16, extraction electrodes 17 and 18, and tip-of-arm electrodes 24 and 25 of the crystal vibration piece 3 are thin films in which a metal, for example, gold, is deposited on chromium layers formed by metallization on the arm portions 11 and 12. Such a thin film is formed on the whole surface of a base material by, for example, vacuum deposition or sputtering and then shaped into a desired form by metal etching using photolithography. The metals used in the first and second driving electrodes 15 and 16, extraction electrodes 17 and 18, and tip-of-arm electrodes 24 and 25 are not necessarily limited to the combination of chromium and gold, and may instead be the combination of chromium and silver.

The frequency adjustment metal films 19 and 20 are formed on the tip-side parts 11a and 12a of the arm portions 11 and 12 on their free end side by, for example, plating such as electrolytic plating. The frequency adjustment metal films 19 and 20 may preferably be formed in the process of forming the metal bumps 8 described later. In this embodiment, gold (Au) is used to form these metal films 19 and 20.

The extraction electrode 17 is formed in a first joining portion 13b on one end side of the joining portion 13. The extraction electrode 17 is extracted from the first driving electrode 15 so as to extend to the first joining portion 13b. The extraction electrode 18 is formed in a second joining portion 13a on the other end side of the joining portion 13. The extraction electrode 18 is extracted from the second driving electrode 16 so as to extend to the second joining portion 13a.

Two metal bumps 8 made of, for example, gold are formed in the joining portion 13 on the other main-surface side illustrated in FIG. 4 to be joined to the electrode pads 7 of the base 4. One of the metal bumps 8 is formed on the extraction electrode 17 of the first joining portion 13b extracted from the first driving electrode 15, while the other one of the metal bumps 8 is formed on the extraction electrode 18 of the second joining portion 13a extracted from the second driving electrode 16. The joining portion 13, which constitutes the stem portion 10 in part, is joined to the electrode pads 7 of the base 4 and accordingly serves to support the crystal vibration piece 3. The metal bump 8 described herein has an oval shape in plan view, however, may be shaped otherwise. The shape of the metal bump 8 may be circular or polygonal, for example, rectangular or square. The metal bumps 8 are formed by plating, for example, electrolytic plating.

In the first, second arm portion 11, 12, the width W1 of the tip-side part 11a, 12a provided with the frequency adjustment metal film 19, 20 is greater than the width 2 of any other portions, as described earlier. In this embodiment, the width W1 of the tip-side part 11a, 12a may be, for example, threefold greater than the width W2.

In the first and second arm portions 11 and 12, the tip-side parts 11a and 12a provided with the frequency adjustment metal films 19 and 20 are thus formed in a greater width because of the following reason.

In the tuning fork-type crystal vibration piece, its frequency is inversely proportional to the square of the length of the arm portion and is proportional to the width of the arm portion. To further miniaturize the tuning fork-type crystal vibration piece, reduction of the arm portions in length is desirable, which, however, leads to a higher frequency. To prevent that, the metal film; weight member for frequency adjustment, needs to be formed in a greater area on the tip-side part of the arm portion. Another possible approach to prevent frequency increases to higher frequencies may be reduction of the arm portions in width, which, however, may result in poor values of CI (crystal impedance).

As described earlier, the frequency adjustment metal films are formed on the tip-side parts and serve as weight members in the tuning fork-type crystal vibration piece supported in the package in a cantilever fashion. When the arm portions are desirably reduced in length to further miniaturize the crystal vibration piece without degrading the CI value, therefore, the tip-side parts should be increased in width.

As the tip-side parts of the arm portions thus increased in size, the tuning fork-type crystal vibration piece is more likely to warp under any impact from outside.

Further, an attempt to reduce the crystal vibration piece in thickness leads to smaller clearances above and below the crystal vibration piece 3 in the package 2.

In this embodiment, therefore, a cushioning portion 9 is formed in a certain thickness on the bottom surface of the base 4, so that intermediate parts for contact of the arm portions, which are located at positions leading to their free-end edges, contact the cushioning portion 9 in case the crystal vibration piece supported in the package in a cantilever fashion is warped under impact from outside. This may prevent possible contact between the bottom surface of the base 4 and edges of the arm portions 11 and 12, i.e., edges of the widened tip-side parts 11a and 12a of the arm portions 11 and 12 that are most likely to undergo frequency fluctuations when damaged or broken by the contact, and accordingly prevent undesired damage to or breakage of the corner parts on the edges of the tip-side parts 11a and 12a.

The frequency adjustment metal films 19 and 20 to be partly removed through the laser beam irradiation are formed so as to face the inner surface of the lid member 5 and contact the inner surface of the lid member 5 in case the tuning fork-type vibration piece 3 is warped toward the lid member Sunder impact from outside. This may avoid any contact between the inner surface of the lid member 5 and edges of the widened tip-side parts 11a and 12a of the arm portions 11 and 12 on their free end side and damage to or breakage of corner parts on these edges.

The frequency adjustment metal films 19 and 20 to be partly removed nu laser beam irradiation are hereinafter described.

In the tuning fork-type crystal vibration piece 1 of this embodiment, the frequency adjustment metal films 19 and 20 are formed by electrolytic plating on one of main surfaces of a respective one of the arm portions 11 and 12 on a crystal wafer. Then, the frequency adjustment metal films 19 and 20 are irradiated with a laser beam and thereby partly removed to reduce in mass for coarse frequency adjustment.

Figure 5:
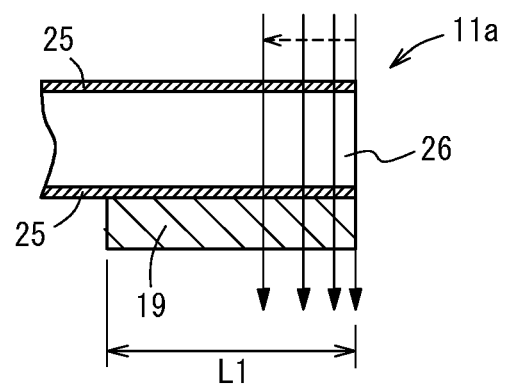
FIG. 5 is a drawing that illustrates coarse frequency adjustment of the crystal vibration piece through laser beam irradiation.

FIG. 5 is a drawing that illustrates coarse frequency adjustment through laser beam irradiation. While FIG. 5 illustrates the frequency adjustment metal film 19 formed on the tip-side part 11a of the first arm portion 11 alone, the laser beam irradiation is applied likewise to the frequency adjustment metal film 20 formed on the tip-side part 12a of the second arm portion 12.

A laser beam source (not illustrated in the drawings) is positioned so as to face one main-surface side of each of the crystal vibration pieces 3 on the crystal wafer. The laser beam is then radiated from the source so as to remove the frequency adjustment metal film 19 on the other main-surface side.

This laser beam irradiation starts at the tip-side part (right side in FIG. 5) where the mass reduction induces a highest level of frequency fluctuation, advancing along the width direction of the first arm portion 11 (direction perpendicular to the drawing of FIG. 5) at positions shifted by degrees toward the stem portion 10 of the first arm portion 11 (left side on FIG. 5).

The radiated laser beam enters one main-surface side of each of the crystal vibration pieces 3 on the crystal wafer and transmits through crystal 26 inside of the crystal vibration piece 3, and then arrives at the frequency adjustment metal film 19 formed on the opposite main-surface side, consequently removing the tip-of-arm electrode 25 and the frequency adjustment metal film 19 on the respective main surfaces.

The frequency adjustment metal film 19 is removed by thus irradiating this film with the laser beam directed from the upper side and transmitting through the crystal 26 inside of the crystal vibration piece 3. At the time, any metal fragments chipped off the frequency adjustment metal film 19 may fly downward away from this metal film. This may prevent the metal fragments from adhering again to the crystal vibration piece 3. The laser beam may be directed so as to transmit through the crystal from the lower to upper side of the crystal vibration piece 3. The laser used in this embodiment is a green laser, however, may be selected from other lasers having different wavelengths, including YAG laser.

The multiple tuning fork-type crystal vibration pieces 3 on the crystal wafer are thus irradiated with a laser beam to remove the frequency adjustment metal films in part for coarse frequency adjustment. In the manufacture of microminiaturized tuning fork-type crystal vibration pieces, the extent of coarse frequency adjustment may have to be increased.

In microminiaturized crystal vibrators having outer dimensions of, for example, 1.2 mm×1.0 or less in plan view, crystal vibration pieces mounted therein are correspondingly smaller. The manufacture of such miniaturized tuning fork-type vibration pieces requires a high machining accuracy. The machining accuracy, however, can only be improved to a limited extent, and frequencies of the multiple tuning fork-type vibration pieces formed on the wafer may be more variable as the crystal vibration pieces are further miniaturized. To allow the frequencies thus variable to stay within a required range of frequencies, the extent of coarse adjustment may have to be increased.

In order to increase the extent of coarse frequency adjustment performed through the laser beam irradiation, it may be necessary to thicken the frequency adjustment metal film that can only be formed in a limited area of the crystal vibration piece.

In this embodiment, the frequency adjustment metal films 19 and 20 partly removed by the laser beam irradiation serve to contact the inner surface of the lid member 5 in case the arm portions 11 and 12 of the tuning fork-type crystal vibration piece 3 are warped toward the lid member 5 under impact from outside. To this end, the frequency adjustment metal films 19 and 20 may desirably have a relatively large thickness, for example, a thickness greater than or equal to 9 µm. In this embodiment, the frequency adjustment metal films 19 and 20 are formed by, for example, plating in a thickness of approximately 10 µm.

The multiple tuning fork-type crystal vibration pieces, subsequent to coarse frequency adjustment under the laser beam irradiation, are broken off the wafer into individual pieces, which are each joined to the electrode pads 7 of the base 4 and mounted in the package 2. Then, final fine frequency adjustment is performed on the crystal vibration piece 3 joined to the electrode pads 7 of the base 4 in the package 2. The frequency adjustment metal films 19 and 20 being formed on one main-surface side alone provides two advantages; improved efficiency of frequency adjustment, and effective reduction of the amount of metal used.

Figure 6:
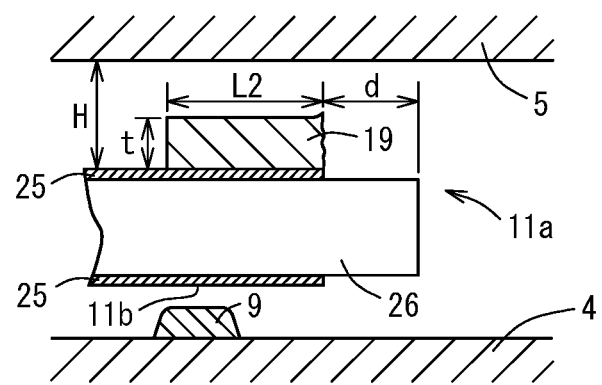
FIG. 6 is a schematic view in cross section of an edge and its vicinity of the crystal vibration piece housed in a package.

FIG. 6 is a schematic view in cross section of an edge and its vicinity of the tuning fork-type crystal vibration piece 3 housed in the package 2. While FIG. 6 illustrates the tip-side part 11a of the first arm portion 11, the same applies to the tip-side part 12a of the second arm portion 12.

In the tuning fork-type crystal vibration piece 3 housed in the package 2, the frequency adjustment metal film 19 formed on one main-surface side is facing the inner surface of the lid member 5, while the other main-surface side of the crystal vibration piece 3 is facing the bottom surface of the base 4.

In case the tuning fork-type crystal vibration piece 3 supported in the package in a cantilever fashion is warped under impact from outside toward the bottom surface of the base 4, a part for contact 11b of the first arm portion 11, which is located at an intermediate position leading to its edge, contacts the cushioning portion 9 formed on the bottom surface of the base 4, as illustrated in FIG. 6. This may prevent possible contact between the bottom surface of the base 4 and the edge of the first arm portion, i.e., edge of the widened tip-side part 11a of the first arm portion 11 most likely to undergo frequency fluctuations if damaged or broken. Likewise, a part for contact 12b of the second arm portion 12 (not illustrated in the drawing), which is located at an intermediate position leading to its edge, contacts the cushioning portion 9 so as to prevent possible contact between the bottom surface of the base 4 and the widened tip-side part 12a of the second arm portion 12.

The tuning fork-type crystal vibration pieces 3 on the crystal wafer area each subjected to coarse frequency adjustment through the laser beam irradiation, so that its frequency stays within a required range of frequencies. At the time, how much of the frequency adjustment metal films 19 and 20 should be removed may differ from one crystal vibration piece 3 to another. In this embodiment, the frequency adjustment metal film 19, 20 is left unremoved in a length greater than half a length of the region where the metal film is formed along the longitudinal direction of the arm portion 11, 12 (lateral direction on FIG. 6).

The longitudinal length "L2" of the frequency adjustment metal film 19, 20 illustrated in FIG. 6 after the coarse frequency adjustment is, L2>0.5L1, where "L1" is the longitudinal length of the frequency adjustment metal film 19, 20 illustrated in FIG. 5 before the coarse frequency adjustment.

In this embodiment, the L1 is 0.2 mm, and the L2 is, therefore, greater than 0.1 mm.

The frequency adjustment metal film 19, 20 is removed by the laser beam irradiation in a length equal to or less than half the longitudinal length L1. This may be rephrased that the frequency adjustment metal film 19, 20 remains unremoved in a length greater than half the longitudinal length L1. When the arm portions 11 and 12 of the crystal vibration piece 3 are warped toward the lid member 5, the remaining frequency adjustment metal films 19 and 20 are allowed to contact the inner surface of the lid member 5. This may prevent possible contact of edges of the widened tip-side parts 11a and 12a of the first and second arm portions 11 and 12 with the inner surface of the lid member 5 and accordingly prevent damage to or breakage of corner parts on the edges of the tip-side parts 11a and 12a possibly caused by the contact.

The frequency adjustment metal film 19, 20 has a thickness "t" greater than or equal to 9 µm, which may be thick enough to alleviate any shock caused by contact of these metal films with the inner surface of the lid member 5.

The longitudinal length L2 of the frequency adjustment metal film 19, 20 after the coarse frequency adjustment is greater than, for example, 0.1 mm. Therefore, a length "d" of a removed portion of the frequency adjustment metal film 19, 20 from its edge part may be, for example, 0.1 mm or less. The length d of the laser-removed portion of the frequency adjustment metal film 19, 20 may differ from one crystal vibration piece to another, and may be d=0 in some of them.

Assuming that "L" is the length of the tuning fork-type crystal vibration piece 3 illustrated in FIG. 3, the L in this embodiment may be, for example, 0.9 mm.

The length d of the laser-removed portion of the frequency adjustment metal film 19, 20 is 0.1 mm or less. Therefore, the ratio of the length d to the length "L" of the tuning fork-type crystal vibration piece 3 is $d/L < 0.1/0.9 = 0.11$, i.e., $d/L < 0.11$.

Provided that "t" is the thickness of the frequency adjustment metal film 19, 20, and "H" is an interval between the inner surface of the lid member 5 and a part of the arm portion 11 where no frequency adjustment metal film is formed, the interval H in this embodiment may be, for example, 35 μm, and the thickness t of the frequency adjustment metal film 19, 20 may preferably be, for example, greater than or equal to 9 μm and less than or equal to 15 μm.

The ratio of the thickness t of the frequency adjustment metal film 19, 20 to the interval H, i.e., the ratio t/H, is $9/35 = 0.257$ or $15/35 = 0.429$, or preferably in the range of $0.25 < t/H < 0.43$.

The ratio of the thickness t of the frequency adjustment metal film 19, 20 to the interval H may preferably be greater than or equal to 0.25 and less than or equal to 0.43.

In case the arm portions 19 and 20 of the tuning fork-type crystal vibration piece 3 are warped toward the lid member 5 under impact from outside, the frequency adjustment metal films 19 and 20, the thickness t of which is smaller than 9 μm, may increase the likelihood that edges of the tip-side parts 11a and 12a of the arm portions 11 and 12 contact the inner surface of the lid member 5 before the remainder of these metal films can make any contact, which involves a higher risk of damage to or breakage of corner parts on these edges. Further, the frequency adjustment metal films 19 and 20 may be not thick enough to absorb any shock generated at the time of contact with the inner surface of the lid member 5.

On the other hand, the frequency adjustment metal films 19 and 20, the thickness t of which is greater than 15 μm, may unnecessarily increase the chance of contact with the metal-made lid member 5 even when affected by a very small impact from outside.

The longitudinal length of the frequency adjustment metal film 19, 20 removed by the laser beam irradiation is controlled to be equal to or less than half the length of this metal film before the coarse frequency adjustment, as described below. In this embodiment, a higher first target frequency than conventionally employed first target frequencies is set for a step of forming electrodes in the stem portions and the arm portions extending from the stem portions of multiple tuning fork-type vibration pieces integrally coupled on a crystal wafer.

Figure 7:
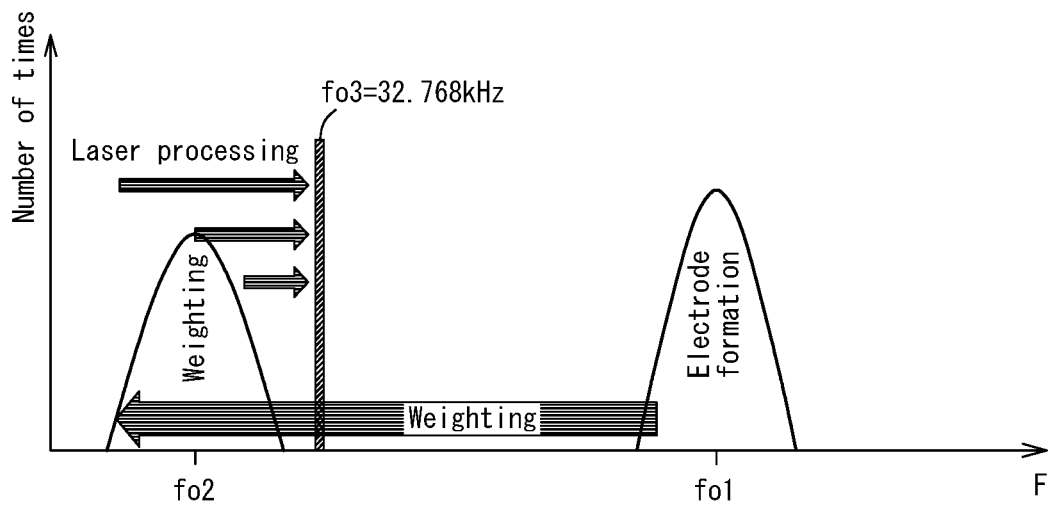
FIG. 7 is a drawing that illustrates target frequencies in an electrode forming step, a weighting step, and a laser processing step.
Figure 8:
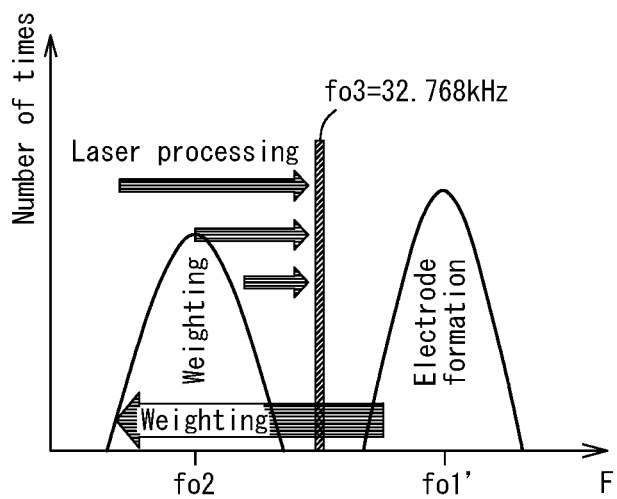
FIG. 8 is a drawing of the known art illustrated correspondingly to FIG. 7.

FIG. 7 is a drawing that illustrates target frequencies in respective steps according to this embodiment; electrode forming step, weighting step of forming the frequency adjustment metal films 19 and 20, and coarse frequency adjustment (laser processing) step using laser beam irradiation. FIG. 8 is a drawing of the known art illustrated correspondingly to FIG. 7. In FIGS. 7 and 8, lateral and vertical respectively represent frequency and number of times.

In this embodiment, a first target frequency fo1 illustrated in FIG. 7 is a frequency set for the electrode forming step; first step, of forming electrodes in the stem portions and in the arm portions extending from the stem portions of multiple tuning fork-type vibration pieces integrally coupled on a crystal wafer. This first target frequency fo1 is higher than a first target frequency fo1' employed in an electrode forming step of the known art illustrated in FIG. 8.

A second target frequency fo2 illustrated in FIG. 7 is a frequency set for the weighting step, second step, of forming the frequency adjustment metal films 19 and 20 on the tip-side parts 11a and 12a of the arm portions 11 and 12 of the crystal vibration piece 3. This second target frequency fo2 is equal to a second target frequency fo2 illustrated in FIG. 8 employed in a weighting step of the known art illustrated in FIG. 8.

In the weighting step of forming the frequency adjustment metal films 19 and 20 on the tip-side parts 11a and 12a, therefore, the frequency adjustment metal films 19 and 20 are formed in a greater amount than in the known art (larger weighting amount).

A third target frequency fo3 set for the coarse frequency adjustment step using laser beam irradiation, which follows the weighting step, is the nominal frequency 32.768 kHz. This frequency is equal to a third target frequency fo2 employed in a coarse frequency adjustment step using laser beam irradiation of the known art illustrated in FIG. 8.

In the laser-used coarse frequency adjustment step, the frequency adjustment metal films 19 and 20 are removed in a substantially equal amount to that in the known art.

The multiple tuning fork-type crystal vibration pieces 3 on the crystal wafer subsequent to the laser-used coarse frequency adjustment are broken off the crystal wafer into individual pieces. Then, in a fourth step, each individual tuning fork-type crystal vibration piece 3 is housed in the package 2 after its metal bumps 8 are joined to the electrode pads 7 on the base 4, and then sealed in the package 2 with the lid member 5.

In the tuning fork-type crystal vibration piece of this embodiment, |fo1−fo2| is an absolute value of difference between the first target frequency fo1 in the electrode forming step and the second target frequency fo2 in the weighing step, |fo2−fo3| is an absolute value of difference between the second target frequency fo2 and the third target frequency in the coarse frequency adjustment step, and the ratio of |fo2−fo3| to |fo1−fo2| (|fo2−fo3|/|fo1−fo2|) is less than or equal to 0.5, i.e., (|fo2−fo3|/|fo1−fo2|)<0.5.

In this embodiment, this ratio (|fo2−fo3|/|fo1−fo2|) may be, for example, approximately 0.4.

Thus, the ratio of the amount of frequency adjustment metal films 19 and 20 removed in the coarse frequency adjustment step to the amount of frequency adjustment metal films 19 and 20 formed at edges of the arm portions 11 and 12 in the weighting step may be reduced to a smaller value than in the known art.

As a result, the frequency adjustment metal film 19, 20 may be left unremoved in a length greater than half the length of this metal film along the longitudinal direction after the coarse frequency adjustment step.

In case the arm portions 11 and 12 of the tuning fork-type crystal vibration piece 3 are warped toward the lid member 5 under impact from outside, the remaining frequency adjustment metal films 19 and 20 are allowed to contact the inner surface of the lid member 5. This may avoid any contact of edges of the tip-side parts 11a and 12a in the arm portions 11 and 12 with the inner surface of the lid member 5 and accordingly prevent damage to or breakage of corner parts on these edges possibly caused by the contact.

This embodiment uses the laser beam for frequency adjustments, however, may use one selected from any other suitable beams but the laser beam, for example, ion beam Second Embodiment In the earlier embodiment, the parts for contact 11b and 12b of the arm portions 11 and 12, which are located at intermediate positions leading to their edges, contact the cushioning portion 9 formed in a certain height on the bottom surface of the base 4 so as to avoid any contact of edges of the tip-side parts 11a and 12a of the arm portions 11 and 12 with the bottom surface of the base 4 and damage to or breakage of corner parts on these edges possibly caused by the contact.

The inventors of the present invention, as a result of their various studies and researches, were led to the following finding; when the parts for contact 11b and 12b of the arm portions 11 and 121 contact the cushioning portion 9, thin tip-of-arm electrodes 25 and 24 formed on these parts for contact may be partly chipped off by the contact, which may cause frequency increases to higher frequencies.

Figure 9:
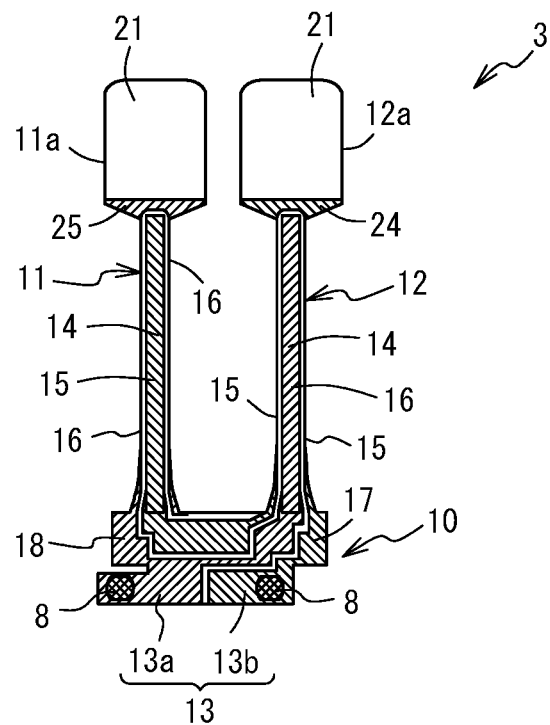
FIG. 9 is a drawing of another embodiment of the present invention illustrated correspondingly to FIG. 4.

This embodiment provides electrodeless regions 21 on the main-surface side facing the bottom surface of the base 4, specifically, the tip-of-arm electrodes 24 and 25 are unformed in the widened regions, except their parts closer to the stem portion 10, of the tip-side parts 11a and 12a of the first and second arm portions 11 and 12, as illustrated in FIG. 9.

Figure 10:
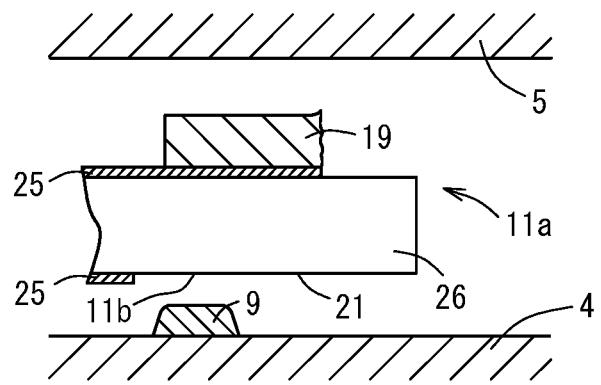
FIG. 10 is a schematic view in cross section of the embodiment of FIG. 9 illustrated correspondingly to FIG. 6.

FIG. 10 is a schematic view in cross section of the embodiment of FIG. 9 illustrated correspondingly to FIG. 6, illustrating an edge side and its vicinity of the tuning fork-type crystal vibration piece 3 housed in the package 2. While FIG. 5 illustrates the tip-side part 11a of the first arm portion 11, the same applies to the tip-side part 12a of the second arm portion 12.

The electrodeless regions on the other main-surface side of the tip-side parts 11a and 12a of the first and second arm portions 11 and 12 include at least the parts for contact 11b and 12b of the first and second arm portions 11 and 12 allowed to contact the cushioning portion 9 in case the tuning fork-type crystal vibration piece supported in the package in a cantilever fashion is warped under impact from outside. The electrode regions are formed so as to extend as far as edges of the first and second arm portions 11 and 12.

The parts for contact 11b and 12b of the first and second arm portions 11 and 12 allowed to contact the cushioning portion 9 formed on the bottom surface of the base 4 are included in the electrodeless regions 21 where no tip-of-arm electrode is formed. Thus, there is no tip-of-arm electrode damageable or breakable by any contact of the parts for contact 11b and 12b with the cushioning portion 9, which may suppress the risk of frequency increases to higher frequencies due to external impact.

In case the arm portions 11 and 12 of the tuning fork-type crystal vibration piece 3 are warped under impact from outside toward the lid member 5 on the opposite side of the base 4 where the cushioning portion 9 is formed, the frequency adjustment metal films 19 and 20 left unremoved are allowed to contact the inner surface of the lid member 5. This may avoid any contact of edges of the arm portions 11 and 12 with the inner surface of the lid member 5 and damage to or breakage of the edges possibly caused by the contact. As a result, impact-caused frequency fluctuations may be unlikely to occur.

In case any impact from outside causes warp of the arm portions 11 and 12 of the tuning fork-type crystal vibration piece 3 toward the base 4, the parts for contact 11b and 12b of the arm portions 11 and 12 possibly contact the cushioning portion 9 on the bottom surface of the base 4. Yet, frequency fluctuations associated with any tip-of-arm electrode being chipped off may be unlikely to occur.

The tuning fork-type crystal vibration piece 3 may successfully prevent frequency fluctuations possibly caused by the arm portions 11 and 12 being warped either toward the base 4 or toward the lid member 5. Thus, the tuning fork-type crystal vibration piece 3 obtained in this embodiment may excel in shock resistance.

The electrodeless regions 21 described herein extend as far as the parts for contact 11b and 12b of the first and second arm portions 11 and 12 that possibly contact the cushioning portion 9 and also as far as edges of the tip-side parts of the first and second arm portions 11 and 12. Instead, the electrodeless regions may be limited to the parts for contact 11b and 12b alone.

The earlier embodiment defines, as the electrodeless regions 21 in the absence of any tip-of-arm electrode, the regions at least including the parts for contact 11b and 12b of the arm portions 11 and 12 allowed to contact the cushioning portion 9 on the bottom surface of the base 4 when the first and second arm portions 11 and 12 are warped toward the bottom surface of the base 4. The present invention may further include an embodiment characterized as described below.

Figure 11:
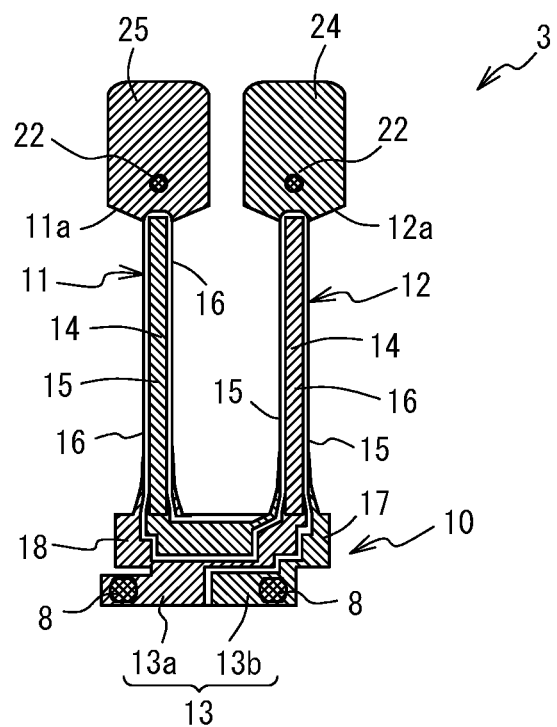
FIG. 11 is a drawing of yet another embodiment of the present invention illustrated correspondingly to FIG. 4.
Figure 12:
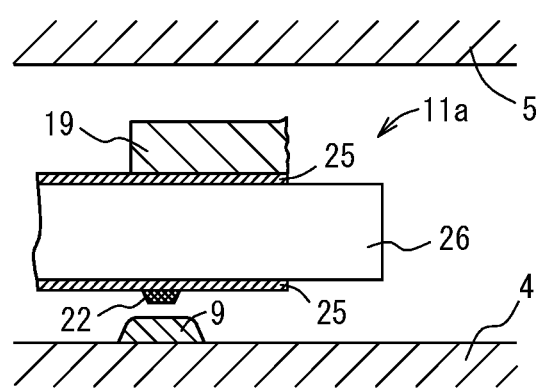
FIG. 12 is a schematic view in cross section of the embodiment of FIG. 10 illustrated correspondingly to FIG. 6.

FIG. 11 is a drawing of yet another embodiment of the present invention illustrated correspondingly to FIG. 4. FIG. 12 is a schematic view in cross section of the embodiment of FIG. 11 illustrated correspondingly to FIG. 6.

In this embodiment, metal films 22; shock absorbers serving to absorb any shock generated at the time of contact, are formed on the tip-side parts 11a and 12a of the first and second arm portions 11 and 12 on the main-surface side facing the bottom surface of the base 4. The metal films 22 are formed in regions that allow them to contact the cushioning portion 9 when the first and second arm portions 11 and 12 are warped toward the bottom surface of the base 4 under impact from outside.

To effectively absorb the impact-caused shock, the metal films 22 may be each formed in a thickness of 1 μm or more, for example, 10 μm in this embodiment. The metal film 22 is made of a metal, like the metal bump 8 described earlier, and is formed by plating, for example, electrolytic plating. The metal films 22 may be formed at the same time as the metal bumps 8.

The metal films 22 are formed in regions that allow them to contact the cushioning portion 9 when the first and second arm portions 11 and 12 are warped toward the bottom surface of the base 4 under impact from outside. In this embodiment, the metal films 22 are formed on the widened tip-side parts 11a and 12a of the first and second arm portions 11 and 12, specifically, at positions on these parts 11a and 12a at the center in the width direction and closer to the stem portion 10. The metal films 22 have a substantially circular shape in plan view.

The metal films 22 that absorb any shock generated at the time of contact with the cushioning portion 9 are formed by plating in a thickness of 1 μm or more in the regions of the first and second arm portions 11 and 12 that allow the metal films 22 to contact the cushioning portion 9 formed on the bottom surface of the base 4. In case the tuning fork-type crystal vibration piece 3 warps under impact from outside, causing the metal films 22 on the arm portions 11 and 12 to contact the cushioning portion 9 on the bottom surface of the base 4, the metal films 22 may be unlikely to peel off and may absorb well any shock generated at the time of contact. This may eliminate the risk of tip-of-arm electrodes being chipped off and may prevent frequency increases to higher frequencies when any impact from outside is applied to the crystal vibration piece.

As illustrated in the schematic cross-sectional view of FIG. 12, the metal films 22 on the other main-surface side of the crystal vibration piece 3 are formed in the parts for contact away from the edges of the arm portions. Therefore, the metal films 22 formed in these regions may be left intact during the laser beam irradiation to partly remove the frequency adjustment metal films 19 and 20 at the edges of the arm portions. Thus, the metal films 22 may adequately absorb any shock at the time of contact between the cushioning portion and the crystal vibration piece 3, and the remaining frequency adjustment metal films 19 and 20 may prevent possible contact between the inner surface of the lid member and the edges of the arm portions.

Figure 13A:
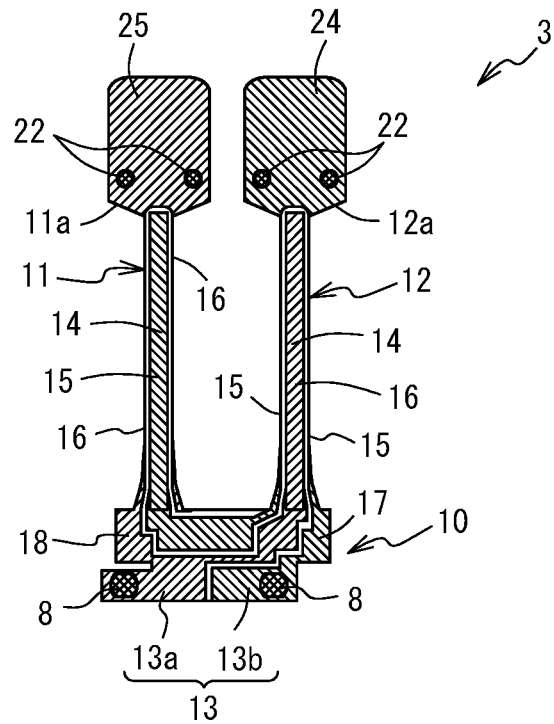
FIG. 13A is a drawing of yet another embodiment of the present invention illustrated correspondingly to FIG. 4.
Figure 13B:
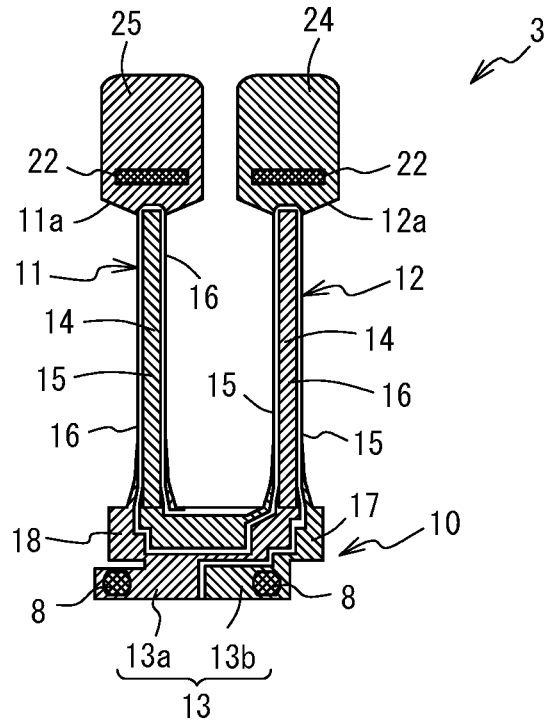
FIG. 13B is a drawing of yet another embodiment of the present invention illustrated correspondingly to FIG. 4.

The metal films 22; shock absorbers, each formed at one position of the arm portion in this embodiment may be formed at more than one, for example, two positions on a respective one of the arm portions, as illustrated in FIG. 13A The metal film 22 circular in plan view may be formed otherwise, for example, may be formed in a rectangular shape in plan view along the width direction of the tip-side part 11a, 12a of the arm portion 11, 12, as illustrated in FIG. 13B.

In this embodiment, the tip-of-arm electrodes 24 and 25 are provided where the metal films 22; shock absorbers, are formed. In other embodiments of the present invention, a region of the metal film 22 including its surrounding area may be an electrodeless region where the raw surface of crystal is exposed in the absence of any tip-of-arm electrode.

Figure 14:
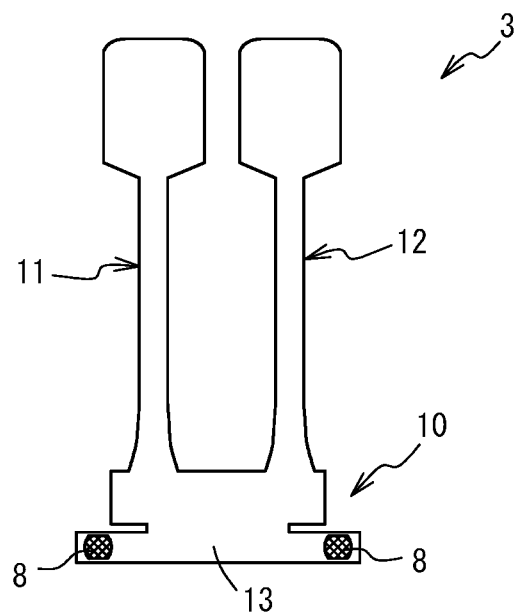
FIG. 14 is a drawing that illustrates the outer shape of a tuning fork-type crystal vibration piece according to yet another embodiment of the present invention.
Figure 15:
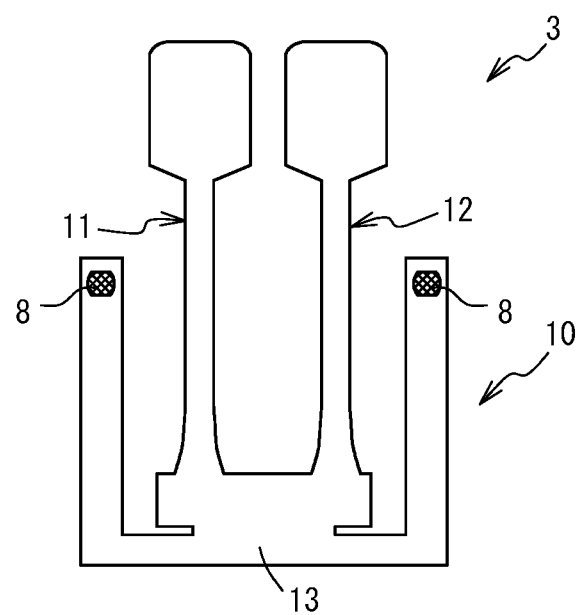
FIG. 15 is a drawing that illustrates the outer shape of a tuning fork-type crystal vibration piece according to yet another embodiment of the present invention.
Figure 16:
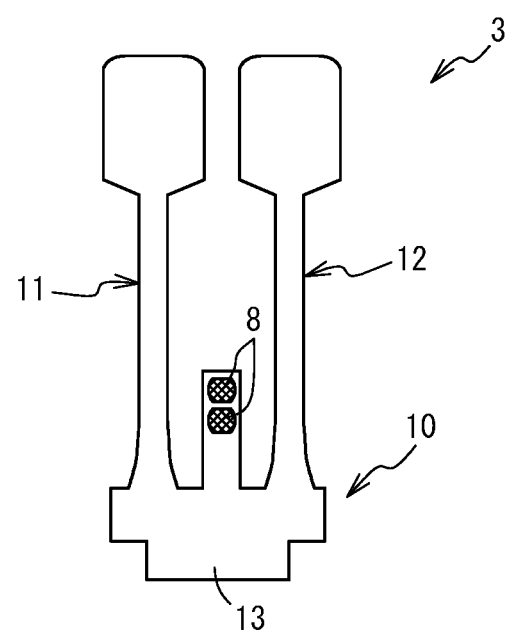
FIG. 16 is a drawing that illustrates the outer shape of a tuning fork-type crystal vibration piece according to yet another embodiment of the present invention.

In the embodiments described thus far, the joining portion 13 constituting part of the stem portion 10 extends in a direction opposite to the extending direction of the first, second arm portion 11, 12 and then in a direction orthogonal to the extending direction (rightward in FIG. 3). The joining portion 13 may have a laterally symmetrical shape, lateral ends of which extend in two directions included in the orthogonal direction (leftward and rightward in FIG. 14), as is known from the outer shape of the crystal vibration piece 3 illustrated in FIG. 14. As illustrated in FIG. 15, the joining portion 13 may have a laterally symmetrical shape, lateral ends of which extend in two directions included in the orthogonal direction (leftward and rightward in FIG. 15) and further extend parallel to the extending direction of the first, second arm portion 11, 12. As illustrated in FIG. 16, the joining portion 13 may extend from between the first and second arm portions 11 and 12 along the extending direction of these arm portions. In the crystal vibration piece 3 in which the joining portion 13 is shaped as described so far, two metal bumps 8 to be joined to the electrode pads 7 of the base 4 are located at an end(s) of the extending joining portion 13, as illustrated in FIGS. 14 to 16. The joining portion 13 may or may not have a portion(s) formed along the extending direction or a direction(s) orthogonal to the extending direction.

In the embodiments described thus far, the present invention is applied to the tuning fork-type crystal vibration piece. The present invention may also be applicable to any other suitable piezoelectric materials but crystal.

REFERENCE SIGNS LIST 1 tuning fork-type crystal vibrator
2 package
3 tuning fork-type crystal vibration piece
4 base
5 lid member
7 electrode pad
8 metal bump
9 cushioning portion
10 stem portion
11 first arm portion
12 second arm portion
13 joining portion
15 first driving electrode
16 second driving electrode
17, 18 extraction electrode
19, 20 frequency adjustment metal film
21 electrodeless region
22 metal film (shock absorber)
24, 25 tip-of-arm electrode
26 crystal

The invention claimed is:

1. A tuning fork-type vibrator comprising:
a tuning fork-type vibration piece including a stem portion and a plurality of arm portions extending from the stem portion;
a package body including a housing portion in which the tuning fork-type vibration piece is housed; and
a lid member that seals an opening of the package body containing the tuning fork-type vibration piece,
wherein
the stem portion is joined to an electrode in the housing portion of the package,
wherein
the plurality of arm portions comprise frequency adjustment metal films formed at free ends on surfaces thereof facing an inner surface of the lid member, the frequency adjustment metal films having been partly removed,
wherein
in case the plurality of arm portions are warped toward the lid member, the frequency adjustment metal films partly removed contact the inner surface of the lid member so as to avoid contact of edges on the free ends of the plurality of arm portions with the inner surface of the lid member, wherein
d/L is less than or equal to 0.11, where d is a length of the frequency adjustment metal films removed from the edges on the free ends of the plurality of arm portions along the longitudinal direction, and L is a length of the tuning fork-type vibration piece, and
t/H is greater than or equal to 0.25 and less than or equal to 0.43, where t is a thickness of the frequency adjustment metal films, and H is an interval between the inner surface of the lid member and a part of the plurality of arm portions where the frequency adjustment metal films are unformed,
wherein
the frequency adjustment metal films formed at the free ends are partly removed along a longitudinal direction of the plurality of arm portions from edges on the free ends toward the stem portion in a length less than or equal to half a length of the frequency adjustment metal films along the longitudinal direction,
and wherein
the free ends of the plurality of arm portions provided with the frequency adjustment metal films are greater in width than any other parts of the plurality of arm portions.

2. The tuning fork-type vibrator according to claim 1, wherein
the frequency adjustment metal films have a thickness greater than or equal to 9 μm.

3. The tuning fork-type vibrator according to claim 1, wherein
the stem portion comprises a metal bump formed to join the tuning fork-type vibration piece to the electrode in the housing portion of the package body, and the metal bump includes a material used to form the frequency adjustment metal films.

4. A manufacturing method for a tuning fork-type vibrator, comprising:

a first step of forming electrodes in a stem portion and in a plurality of arm portions extending from the stem portion of a respective one of a plurality of tuning fork-type vibration pieces integrally coupled on a wafer;

a second step of forming a frequency adjustment metal film at one end on one of front and back main surfaces of a respective one of the plurality of arm portions in a direction of extension thereof;

a third step of performing frequency adjustment by partly removing the frequency adjustment metal films formed at the one ends; and a fourth step of housing each one of the plurality of tuning fork-type vibration pieces divided and separated from the wafer in a housing portion formed in a package body and then sealing an opening of the package body with a lid member, wherein the second step further comprises the one end of the arm portions in the direction of extension having a width wider than the width of the arm portions other than the one end, and the fourth step further comprises joining the stem portion of each one of the plurality of tuning fork-type vibration pieces to an electrode in the housing portion of the package body in a manner that the one of the front and back main surfaces faces a lid member, a ratio of an absolute value of difference between a second target frequency in the second step and a third target frequency in the third step to an absolute value of difference between the second target frequency and a first target frequency in the first step is less than or equal to 0.5, and wherein the third step further comprises removing the frequency adjustment metal film over a length of half or less thereof toward the stem portion along the extension direction from the tip end of the arm portions, and where 'd' is the length of the removed frequency adjustment metal film and 'L' is the length of the tuning fork-type vibration pieces, 'd/L' is 0.11 or less, and the frequency adjusting metal film formed in the second step has a thickness of 't', and a distance of 'H' from the inner surface of the lid to the arm portion where the frequency adjusting metal film is not formed and 't/H' is 0.25 or more and 0.43 or less.

5. The manufacturing method according to claim 4, wherein in the second step, the frequency adjustment metal films are formed in a thickness greater than or equal to 9 μm.

\* \* \* \* \*